United States Patent [19]

Sideris

[11] 4,025,953
[45] May 24, 1977

[54] FREQUENCY SYNTHESIZER TUNING SYSTEM FOR TELEVISION RECEIVERS

[75] Inventor: Sotirios Sideris, Des Plaines, Ill.

[73] Assignee: Quasar Electronics Corporation, Franklin Park, Ill.

[22] Filed: Nov. 26, 1975

[21] Appl. No.: 635,716

[52] U.S. Cl. .............................. 358/191; 325/420; 325/464

[51] Int. Cl.² ........................................ H04N 5/44

[58] Field of Search .......... 325/419, 420, 421, 423, 325/452, 453, 457, 458, 459, 464; 178/5.8 AF, 5.8 R, DIG. 15

[56] References Cited

UNITED STATES PATENTS

| | | | |
|---|---|---|---|
| 3,459,887 | 8/1969 | Baker | 178/5.8 R X |
| 3,737,565 | 6/1973 | Ma et al. | 178/5.8 R |
| 3,825,838 | 7/1974 | Mayle | 178/5.8 AF X |
| 3,845,393 | 10/1974 | Basset | 325/417 X |
| 3,867,568 | 2/1975 | Merriweather | 178/5.8 AF |
| 3,944,925 | 3/1976 | De Laune | 325/420 X |
| 3,946,329 | 3/1976 | Caspari | 325/423 |
| 3,949,158 | 4/1976 | Rzeszewski et al. | 178/5.8 AF |

Primary Examiner—Robert L. Griffin
Assistant Examiner—Aristotelis M. Psitos
Attorney, Agent, or Firm—Drummond, Nelson & Ptak

[57] ABSTRACT

A television tuning system employs a frequency synthesizer system for establishing the tuning of the receiver. A programmable frequency divider, controlled by a reversible counter, is connected between the output of a reference oscillator and a phase comparator to which the output of the local oscillator in the tuner also is applied. The phase comparator output provides a tuning voltage for controlling the tuning of the local oscillator. A logic circuit is coupled to sense predetermined relationships of signals from a picture carrier detector, a sound carrier detector, an AFT signal, and the presence of vertical synchronization signal components for changing the count in the reversible binary counter to adjust the programmable frequency divider to compensate for channel frequency offsets which may occur in excess of the pull-in range of the AFT circuit.

11 Claims, 5 Drawing Figures

FREQUENCY SYNTHESIZER TUNING SYSTEM FOR TELEVISION RECEIVERS

BACKGROUND OF THE INVENTION

As improvements continually have been made in television receivers, the number of adjustments which must be made by the viewer have been substantially reduced. One adjustment, however, which still remains in most receivers is a fine tuning adjustment. Such an adjustment is required even with receivers having automatic fine tuning (AFT or AFC) systems in them. With respect to the VHF channels, the fine tuning adjustment generally is made only when the receiver is first put into operation and then infrequently afterwards as components of the receiver age. For UHF channels, however, a fine tuning adjustment generally is required each time the UHF station is tuned in by the viewer. This is annoying and it is desirable to eliminate the need to such a fine tuning adjustment.

Copending application Ser. No. 537,692, filed Dec. 31, 1974, now U.S. Pat. No. 3,949,158, issued Apr. 6, 1976, is directed to a wide band AFT system which utilizes digital logic circuitry to extend the automatic control range of an AFT system by as much as ±2 megahertz. Such a system substantially minimizes, and in many cases eliminates, the need for fine tuning adjustments of television receivers which are rough-tuned by conventional detent-type turret tuners and the like.

It is desirable to employ channel selection systems in television receivers which permit direct selection of channels without the necessity of tuning through unused or unwanted channels to arrive at the desired channel. Many techniques have been suggested for accomplishing this. Most such direct select tuning systems employ a push button keyboard of the type commonly found in hand-held calculators or push button telephones to select the channel numbers. Decoding logic then is employed to change the keyboard information for selecting the channel into a form which effects the desired tuning of the receiver.

An ideal system for converting keyboarded direct select channel information into a usable control signal for tuning the receiver is a frequency synthesizer tuning system. Generally, this is accomplished by employing a programmable frequency divider between the output of the local oscillator or tuning oscillator of the receiver and one input to a phase comparator. The other input to the phase comparator is obtained from the output of a reference oscillator; and the output of the phase comparator comprises a tuning voltage which is used to control the frequency of the local oscillator. The division ratio of the programmable frequency divider is selected directly by the channel selection keyboard. Theoretically, this type of system is ideal for eliminating the need for fine tuning adjustments of a television receiver, so long as the reference oscillator is a highly stable oscillator. But even with a highly stable reference oscillator, frequency synthesizer systems fail to maintain proper tuning of television receivers in all cases, primarily because the signals from transmitting stations are not precisely maintained at the proper frequencies.

Thus, even with frequency synthesizer systems, it is necessary to employ an AFT or AFC circuit to take care of minor mistuning variations. For the most part, a conventional AFT system having a ±1 mHz pull-in range will be sufficient for a frequency synthesizer tuning system. In master antenna TV distribution systems, however, the UHF channels, and in some instances the UHF channels, are translated to an unused VHF channel. Such distribution systems are widely used, primarily in large cities, and particularly in hotel and motel installations. When inexpensive equipment is used for the translation, the resultant carrier may be mistuned a significant amount from the proper frequency. The amount of mistuning can easily be in excess of ±1 megahertz, the normal pull-in range of a good AFT or AFC system. It can even exceed ±2 megahertz. In the case where a conventional frequency synthesizer tuning system is used, a frequency off-set of this magnitude in a master antenna distribution system, or in any other case, will result in the mistuning of the received station; and the customer has no way of adjusting the RF oscillator for the mistuning.

It is desirable to automatically correct for frequency offsets in a frequency synthesizer tuning system without affecting the operation of the conventional frequency synthesizer in the tuning system. If this can be accomplished, the obvious advantages of frequency synthesizers in a television tuning system can be realized without the attendant disadvantages which otherwise exist when there is a frequency offset in the signal of the station to which the receiver is being tuned, whether such offset is created by a master antenna TV distribution or results from some other cause.

SUMMARY OF THE INVENTION

Accordingly, it is an object of this invention to provide an improved tuning system for a television receiver.

It is an additional object of this invention to provide an improved frequency synthesizer tuning system for a television receiver.

It is another object of this invention to provide an improved frequency synthesizer tuning system for a television receiver which includes a provision for adjusting the synthesizer loop for frequency offsets in the received signal.

It is a further object of this invention to tune the local RF oscillator of a television receiver to the correct frequency with a frequency synthesizer tuning system, and to automatically change the reference frequency if the AFT signal produced by the AFT discriminator of the receiver is outside a predetermined window.

In accordance with a preferred embodiment of this invention, a frequency synthesizer tuning system for a television receiver includes a stable reference oscillator and a voltage controlled local oscillator in the tuner. A programmable frequency divider is connected between the output of the reference oscillator and one input to a phase comparator, the other input of which is supplied with the output of the local oscillator. The output of the phase comparator then comprises a control signal which is supplied to the local oscillator to control the frequency of its operation.

Selection of a desired channel by the viewer causes a predetermined division ratio to be established in the programmable frequency divider each time a channel is selected. In addition, however, a control circuit coupled to the output of the AFT circuit changes the division ratio of the programmable frequency divider whenever predetermined signal conditions exist in the AFT signal. This, then, permits the system to adjust for frequency offsets of the received signal which otherwise would cause the station to be mistuned, if a conventional frequency synthesizer tuning system were used.

DETAILED DESCRIPTION

Figure 1:
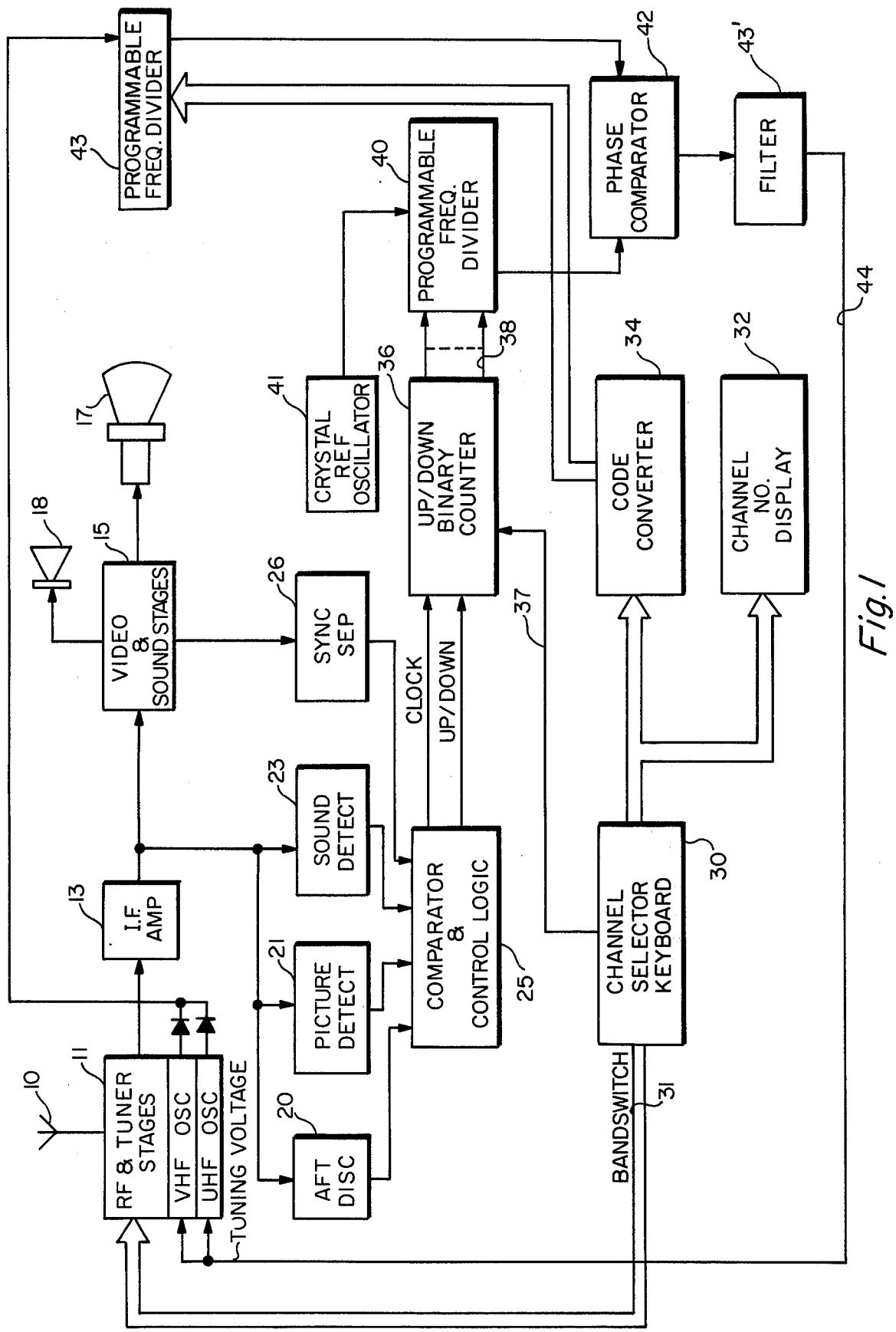
FIG. 1 is a block diagram of a television receiver employing a preferred embodiment of the invention.

Referring now to the drawings, the same reference numbers are used throughout the several views to designate the same or similar components.

FIG. 1 is a block diagram of a television receiver, which may be a black and white or color television receiver. Most of the circuitry of this receiver is conventional, and for that reason it has not been shown in FIG. 1. Added to the conventional television receiver of FIG. 1, however, is a frequency synthesizer tuning system which is capable of automatically changing the reference frequency when a frequency offset exists in the received signal. Transmitted composite television signals, either received over the air or distributed by means of a master antenna TV distribution system, are received by an antenna 10 or on antenna input terminals to the receiver. As is well known, these composite signals include picture and sound carrier components and synchronizing signal components, with the composite signal being applied to an RF and tuner stage 11 of the receiver. The stage 11 includes the RF amplifiers and tuner sections of the receiver, including a VHF oscillator section and a UHF oscillator section, specifically indicated as such in the stage 11 of FIG. 1. Preferably, the UHF and VHF oscillators are voltage controlled oscillators, the frequency of which is varied in response to a tuning voltage applied to them to effect the desired tuning of the receiver.

The output of the RF and tuner stages 11 is applied to an IF amplifier stage 13 which supplies the conventional picture (video) and sound IF signals to the video and sound processing stages 15 of the receiver. The stages 15 may be of any conventional type used to separate, amplify, and otherwise process the signals for application to a cathode ray tube 17 and a loud-speaker 18 which reproduce the picture and sound components, respectively, of the received signal.

The output of the IF amplifier 13 also is supplied to a conventional AFT or automatic fine tuning discriminator circuit 20 for developing an automatic fine tuning control voltage in a conventional manner for maintaining the tuning of tuner stages 11, once proper tuning of the receiver initially has been effected. In addition, the output of the IF amplifier stage 13 is supplied to a narrow band picture carrier detection circuit 21 and a narrow band sound carrier detection circuit 23 which produce output signals whenever a carrier is tuned to the narrow band of frequencies each of these circuits is designed to detect. For a properly tuned television station, the picture carrier detector circuit 21 and the sound carrier detector circuit 23 both will simultaneously produce output signals. If neither of these circuits produces an output signal for a selected channel, this is indicative that no transmitted signal is present for that channel. In addition, if only one of the circuits 21 or 23 produces an output signal, this is indicative of a grossly mistuned condition of the receiver.

The outputs of the discriminator 20 and the detectors 21 and 23 are supplied to a comparator and control logic circuit 25, which also is provided with synchronizing signals, such as the vertical synchronizing signals, obtained from a conventional synchronizing signal separator circuit 26 coupled with the video and sound stages 15 of the receiver.

When the viewer desires to select a new channel, he enters the desired channel number into a channel selector keyboard 30. There are a number of different keyboards which may be employed to accomplish this function, and the particular design is not important to this invention. The channel selector keyboard 30 also may include switching circuitry for providing a band switch function over band switching leads 31 to the RF and tuner stages 11. Once again, this is a straightforward approach to relate the appropriate band switching information to the tuner according to the channel which has been selected. The channel selector keyboard 30 then provides output signals which operate a channel number display 32 to provide an appropriate display of the selected channel number to the viewer.

The signals which are utilized to operate the channel number display 32 also are applied to a code converter circuit 34 which decodes the selected channel number into a parallel encoded signal. This signal is applied to corresponding inputs of a programmable frequency divider 43 to cause the division number to relate the divided-down frequency of the tuner oscillators connected to the input of the divider 43 to the frequency of a reference oscillator for properly tuning the receiver to the selected channel. Conventional frequency synthesizer techniques are employed, except the code converter 34 is necessary because of non-uniform channel spacing of the television signals. It is most convenient to cause the programmable divider 43 to divide by numbers corresponding directly to the oscillator frequency of the selected channel, for example, 101, 107, 113 . . . up to 931.

A timing pulse is applied over a lead 37 each time a new channel number is selected by the keyboard 30. The pulse on the lead 37 is used to load or enter a fixed binary number into a reversible binary counter 36. This number is selected to be at or near the mid-point of the count capacity of the counter 36. The outputs of each of the stages of the binary counter 36 are applied over parallel output leads 38 to corresponding inputs of a second programmable frequency divider 40. A fixed frequency, stable, crystal reference oscillator 41 is coupled to the input of the frequency divider 40 so that the output frequency of the divider 40 is a stable reference frequency used to maintain tuning of the receiver to the selected channel. The output of the frequency divider 40 is supplied to one of two inputs of a phase comparator circuit 42. The other input to the phase comparator is supplied from the selected one of the VHF or UHF oscillators in the tuner stages 11 through the programmable divider circuit 43. The phase comparator 42 operates in a conventional manner to supply a DC tuning control signal through a filter circuit 43 and over a lead 44 to the oscillators in the tuner system 11 to change and maintain their operating frequency.

The operation of the system which has been described thus far is that of a relatively conventional frequency synthesizer system. If, however, there is a frequency offset in the received signal causing the carrier of the received signal to be displaced from the frequency which it should have to some other frequency, it is possible that the system would give the appearance of mistuning to the received station. To eliminate this disadvantage and still retain the advantages of frequency synthesizer tuning, the comparator and control logic circuit 25 is employed in conjunction with the reversible binary counter 36 and programmable frequency divider 40.

Once a new channel has been selected, the frequency synthesizer system tunes the local oscillator in the tuner stages 11 to the correct frequency for that particular channel as described previously. Then the comparator and control logic circuit 25 responds to the output of the AFT discriminator circuit 20 to see if the output voltage of the AFT circuit is within a specified window. If that condition is present, the control logic circuit 25 determines that there is no frequency offset and the system operates as a conventional frequency synthesizer tuning system so long as the picture detector 21, sound detector 23 and vertical synchronizing signals are present. If, however, the AFT voltage at the output of the AFT discriminator 20 is outside this window, or if the proper outputs are not present from the detectors 21 and 23 or the sync separator 26, the comparator and control logic circuit 25 then operates to change the count in the binary counter 36. This change is in the proper direction to effect a corresponding change in the division ratio or division number of the programmable frequency divider 40 to cause the reference oscillator frequency applied to the phase comparator 42 to be automatically changed to correct for the frequency offset.

Figure 2:
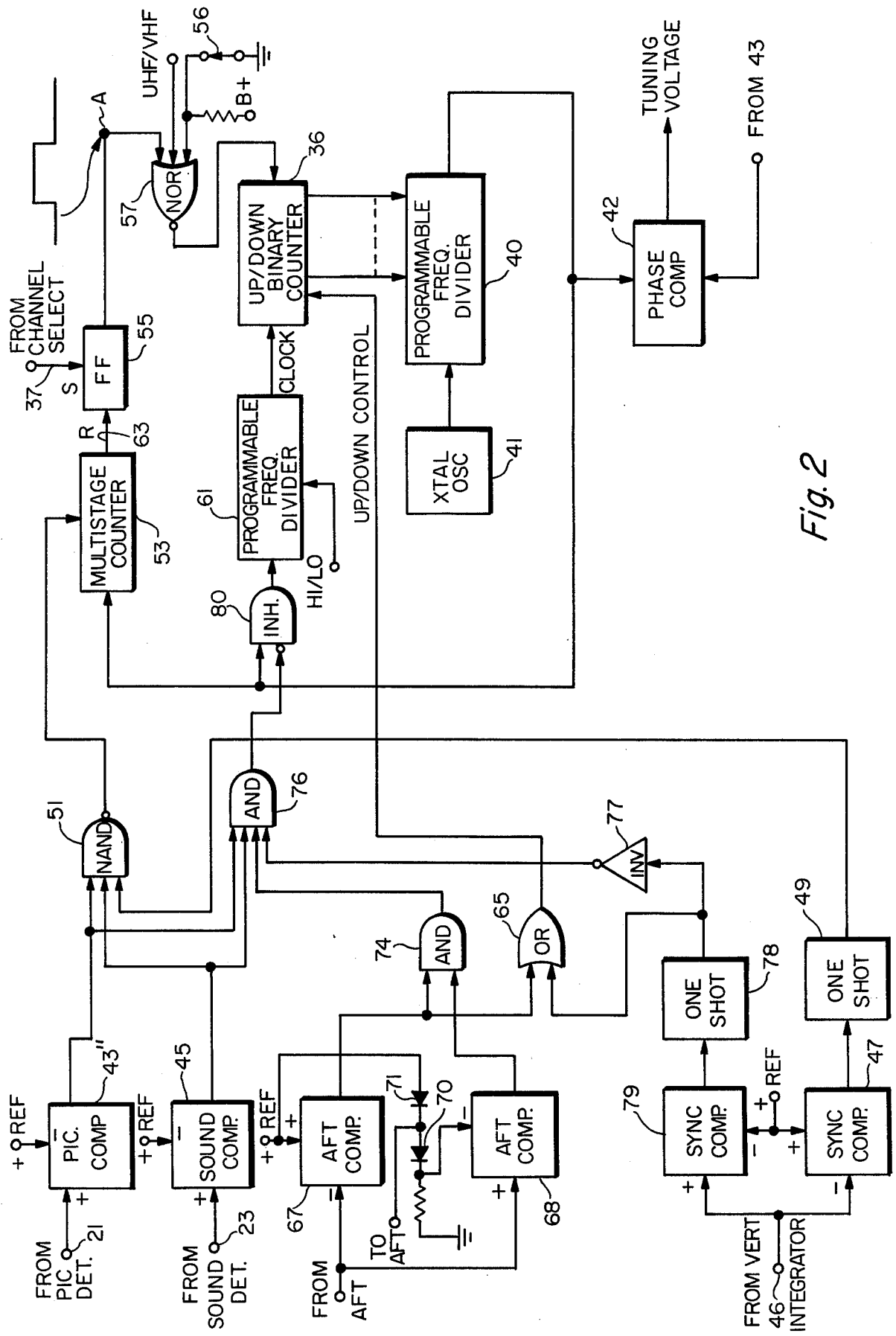
FIG. 2 is a block diagram of a portion of the circuit shown in FIG. 1.

The comparator and control logic circuit 25 are shown in greater detail in FIG. 2 to which reference now should be made. The reversible binary counter 36, programmable frequency divider 40, crystal oscillator 41 and phase comparator 42 are also shown in FIG. 2 to indicate the interrelation of these components of the circuit with the comparator and control logic circuit 25, which comprises the remainder of the circuit of FIG. 2.

As stated previously in conjunction with the description of FIG. 1, when a new channel is selected, the reversible binary counter 36 is set with a predetermined count which is always the same. This count then causes the programmable frequency divider 40 to divide the output of the crystal reference oscillator 41 by an amount which should cause the frequency synthesizer tuning system to accurately tune to the selected channel. The accuracy is a function of the stability of the crystal controlled reference oscillator 41. As also described previously, however, if a frequency offset is present in the signal of the selected channel, the comparator and control logic control circuitry 25 causes the count in the binary counter 36 to be increased or decreased by an amount sufficient to change the division ratio of the programmable frequency divider 40 to effect the desired change in the tuning voltage from the output of the phase comparator 42 necessary to properly tune the local oscillators in the RF and tuner stages 11 of the receiver.

Once the new channel is selected, the presence of a channel signal transmission is detected by the picture detector 21, the sound detector 23, and the sync separator circuit 26 (FIG. 1). If a carrier is detected by the picture detector circuit 21, the output of the picture detector 21 applied to a comparator circuit 43″ causes the output of the comparator 43″ to go high. Similarly, detection of a sound carrier by the sound detector circuit 23 causes the output of a sound comparator circuit 45 to go high.

The third piece of information required to detect the presence of a television signal at the selected channel is obtained from the output of the synchronizing separator circuit 26 in the form of the vertical sync pulses applied to a terminal 46. These pulses are compared in a sync comparator circuit 47 which produces negative or low clock pulses at the vertical rate on its output, each time a vertical sync pulse is applied to the input terminal 46. Each of the pulses at the output of the comparator 47 trigger a retriggerable one-shot multivibrator 49 into its unstable condition. The timing period of the one-shot multivibrator 49 is greater than the interval between vertical synchronizing pulses; so that for normal transmission, the one-shot multivibrator 49 remains in its unstable state. This produces a high output from the multivibrator 49 so long as vertical synchronizing pulses continue to be detected by the comparator circuit 47.

As a consequence, all three of the inputs to a NAND gate 51 are high if a signal transmission is detected by the presence of picture and sound carriers in proper relation to each other, along with vertical synchronizing pulses. The output of the NAND gate 51 when this condition occurs then goes low which clears a multistage counter 53 to an initial or "0" count condition and also prevents the counter 53 from counting so long as this "low" input is applied to it.

Each time a new channel number is selected by the channel selector keyboard 30, a "set" pulse is applied to a flip-flop 55 over the lead 37 causing its output to go high, as indicated by the waveform at point A. The output of the flip-flop 55 is one of three inputs to a NOR gate 57 which produces a low output whenever any of the inputs to it are high. If all of the inputs to the NOR gate 57 is low or ground potential, its output goes high. An offset correction defeat switch 56 is connected to one of the three inputs and this switch is normally closed unless the offset correction feature of the system is not desired. So long as the switch 56 is closed, the lowermost input to the NOR gate 57 is provided with a low or ground potential, as shown in FIG. 2. A VHF/UHF input also normally has a low signal on it. The "high" output of the flip-flop 55 causes a low output from the NOR gate 57. The output of the NOR gate 57 is connected to the reversible counter 36, and whenever this output goes low, the aforementioned predetermined count is set into the counter 36. In addition, so long as the output of the gate 57 remains low, the counter 36 is prevented from changing count.

Thus, if the output of the NAND gate 51 indicates that there is a television signal at the particular channel selected, and vertical synchronizing pulses are correctly received, the output of the NAND gate 51 clears the multistage counter 53 and prevents it from counting any further in response to pulses from the programmable frequency divider 40. Under this condition of operation, the output of the flip-flop 55 remains high, so that the system functions as a conventional frequency synthesizer system.

If, however, following the selection of a channel which loads the binary counter 36 and sets the flip-flop to its high condition, the NAND gate 51 does not produce a clear pulse to the multistage counter 53, the counter 53 continues to be advanced in its count by pulses from the frequency divider 40. A preestablished count then is reached to provide a reset pulse over an output lead 63 to the flip-flop to set it to its logical "0" or low output condition. This causes the output of the NOR gate 57 to go to a logical "1" or high output condition, which in turn enables the reversible counter 36 if the output from a gate 76 also is low at the same time to enable or inhibit gate 80, permitting clock pulses to be passed to the binary counter 36 through a frequency divider 61. These pulses cause the counter 36 to change its count in accordance with the nature of an up-down control signal applied to it over a lead from the output of an up/down control OR gate 65. If this condition has been caused by a channel that has been offset, a point will be reached when the outputs from the picture detector 21, sound detector 23 and vertical integrator on the terminal 46 once again indicate that a proper received channel is present. This then produces an output pulse from the NAND gate 51 which clears and stops the operation of the multistage counter 53. Also, the output from the gate 76 goes high, inhibiting any pulses to the programmable divider 61. The output of the flip-flop 55 when it is high, enables the system to operate with all of the advantages of a conventional frequency synthesizer. When this output is low, it enables the synthesizer to correct for cases when the channel frequency is not of the proper value.

As shown in FIG. 2, the reference potential applied to the comparator circuits 67 and 68 differs by the voltage across two diodes 70 and 71. In addition, the reference voltage is applied to opposite phase terminals of the AFT comparators 67 and 68 which may be of conventional operational amplifier or differential amplifier types. The potential between the two diodes 70 and 71 is applied to the AFT circuit 20 as its center or 0 potential. If the output voltage from the AFT circuit 20 differs no more than the voltage drop across one diode above or below this center point, the outputs of both of the comparator circuits 67 and 68 are high. These high outputs, applied to the input of an AND gate 74, cause a high output to be obtained from that AND gate.

The output of the AND gate 74 is one of four inputs to an AND gate 76, the other three inputs of which are obtained from the comparators 43 and 45 and from an inverter 77 supplied with input signals from a retriggerable one-shot multivibrator 78. This multivibrator in turn is controlled by the output of a second vertical sync signal comparator 79. The vertical synchronizing pulses on the terminal 46 are applied to opposite phase inputs of the synchronizing comparators 47 and 79; so that when synchronizing pulses representative of a properly tuned channel are present, the output of the comparator circuit 79 is a constant high potential. This permits the one-shot multivibrator 78 to time out; so that its output is a normally low output, inverted by the inverter 77 to a high output.

As a consequence, for a properly tuned channel with the AFT potential remaining within the window established by the diodes 70 and 71, the inputs to the AND gate 76 are all high. This results in a high output from the AND gate 76, which is applied to the inhibit input of an inhibit gate 80 to prevent the passage of clock pulses through the inhibit gate 80 from the output of the programmable frequency divider 40. Thus, no clock pulses are supplied through the frequency divider 61 to the reversible counter 36 and no change in the count of the binary counter 36 can take place, even if the potential on the terminal A is low.

If now, for some reason, the AFT voltage applied to the inputs of the comparator circuits 67 and 68 should rise above the voltage between the diodes 70 and 71 to a potential greater than one diode drop, the output of the comparator 67 goes low, while the output of the comparator 68 remains high. This causes the output of the AND gate 74 to go low; so that the output of the AND gate 76 also goes low, enabling the inhibit gate 80. As a consequence, clock pulses applied to the inhibit gate 80 are passed through it and the programmable frequency divider 61 to change the count in the binary counter 36 in response to the application of such clock pulses. The direction in which the count of the binary counter 36 is changed is controlled by the output of an OR gate 65 which has inputs supplied to it from the comparator 67 and the one-shot multivibrator 78.

Figure 4A:
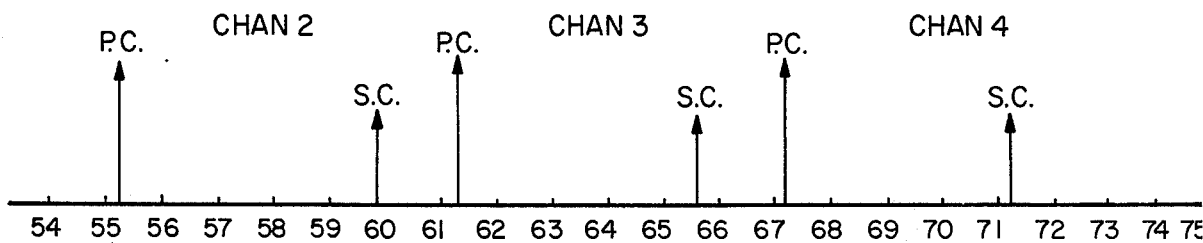
FIGS. 4A and 4B show waveforms useful in explaining the operation of the circuit shown in FIG. 1 and 2.
Figure 4B:
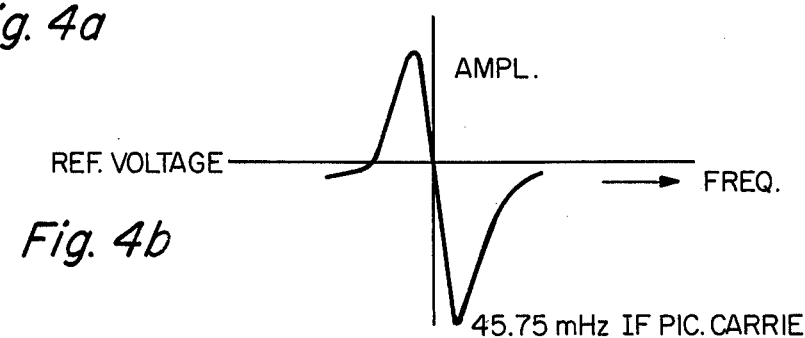

For the condition under discussion, the incoming signal is turned low, that is, toward the next lower adjacent channel. Reference should be made to FIGS. 4A and 4B. FIG. 4B is a plot of the voltage developed by the AFT discriminator 20 which is centered at 45.75 mHz and shows the swing toward a positive voltage above the AFT reference voltage for low tuning. Under these conditions, the sync pulse output from the vertical integrator on the terminal 46 also is normal, so that the output of the one-shot multivibrator 78 remains low. Thus, both inputs to the OR gate 65 are low; so that the potential on the up/down control lead 64 is low, causing the count in the binary counter 36 to advance for the application of each clock pulse applied through the programmable divider 61. This, in turn, causes corresponding changes in the division ratio or division number of the programmable frequency divider 40, thereby resulting in a change in the tuning voltage from the phase comparator 44.

When proper tuning once again is achieved, the AFT signal will be back within the window, the outputs of both AFT comparators 67 and 68 go high; so that the outputs of the AND gates 74 and 76 also go high. This, once again, inhibits the passage of pulses through the inhibit gate 80, thereby terminating the application of further clock pulses to the reversible counter 36. Once this occurs, tuning of the oscillators in the tuner stages 11 is maintained by the normal output of the phase comparator 42 via the lead 44.

If the incoming signal is tuned high, the AFT voltage applied to the inputs of the comparators 67 and 68 drops below the potential at the junction of the diodes 70 and 71. This is tuning toward the next adjacent higher channel as shown in FIGS. 4A and 4B, and results in a relatively negative output from the AFT circuit 20 because the picture carrier is tuned toward the adjacent channel sound trap. Once the voltage of this signal decreases to more than one diode drop below the voltage at the junction of the diodes 70 and 71, the output of the AFT comparator 68 goes low, while the output of the comparator 67 remains high. As a consequence, the outputs of the AND gates 74 and 76 once again go low and clock pulses are passed by the inhibit gate 80. The up/down control potential on the lead 64, however, now is high since the OR gate 65 has a high input applied to it from the comparator 67. Thus, the counter 36 is caused to count in the opposite or reverse direction. This effects the desired reference oscillator frequency correction in the same manner as described previously, but in the opposite direction.

As is well known, there are two positions that the AFT signal from the AFT discriminator 20 crosses the 0 reference voltage; and a lock of the AFT circuit can occur at either of these two positions. One is the correct position for the picture carrier, and the other results from a mistuning toward the adjacent channel sound trap. In this condition, however, the sound information gets into the sync separator circuit 26 and results in a phase inversion of the recovered sync signal obtained at the output of the separator. When this inverted signal is applied to the terminal 46, the normally high output of the comparator 79 now changes to supply negative going pulses in synchronism with the pulses applied to the terminal 46.

At the same time, the one-shot multivibrator 78 now is repeatedly retriggered or reset by the negative pulses applied to its input; so that its output, which was a normally low output, goes high and remains high for the duration of this mistuning condition. This output is inverted by the inverter 77 to override the output of the AND gate 74 and to cause the output of the AND gate 76 to go low, enabling the inhibit gate 80 so that clock pulses can be applied through it and the programmable frequency divider 61 to the reversible counter 36. At the same time, the positive output from the OR gate 65 results in a positive or high signal on the lead 64 to cause the binary counter to count in its reverse direction to effect a tuning of the receiver downward toward the intended channel, since this condition is indicative of a receiver which is mistuned high. Once the required correction has been accomplished, the outputs of the synchronizing comparators 47 and 79 revert back to the original condition of operation, the multistage counter 53 once again is reset, and the inhibit gate 80 is blocked or inhibited from passing further clock pulses.

The frequency divider 61 is made a programmable frequency divider since the correction for each clock pulse is about twice as much in the high VHF range as in the low VHF range. Thus, the frequency of the offset correction is reduced to one-half for the low VHF range by applying the high-low VHF band switching signal to the input terminal 81 to change the frequency divider ratio of the frequency divider 61.

The offset correction achievable with this system can be defeated, if desired, by opening the switch 56. This causes a high potential to be applied to the NOR gate 57, forcing its output low, and preventing reversible counter 36 from counting. This same effect also can be accomplished by applying another input to the NOR gate 57, controlled by the VHF/UHF band switching signal from the channel selection keyboard 30 to apply a positive or high potential to a third input of the NOR gate 57 for the receipt of UHF channels, since offset correction generally is not required for tuning to UHF stations. These latter additional controls, however, for the NOR gate 57 are not necessary to the basic operation of the system. If they are not desired, the NOR gate 57 may be eliminated and the output of the flip-flop 55 can be connected directly to the counter 36.

Figure 3:
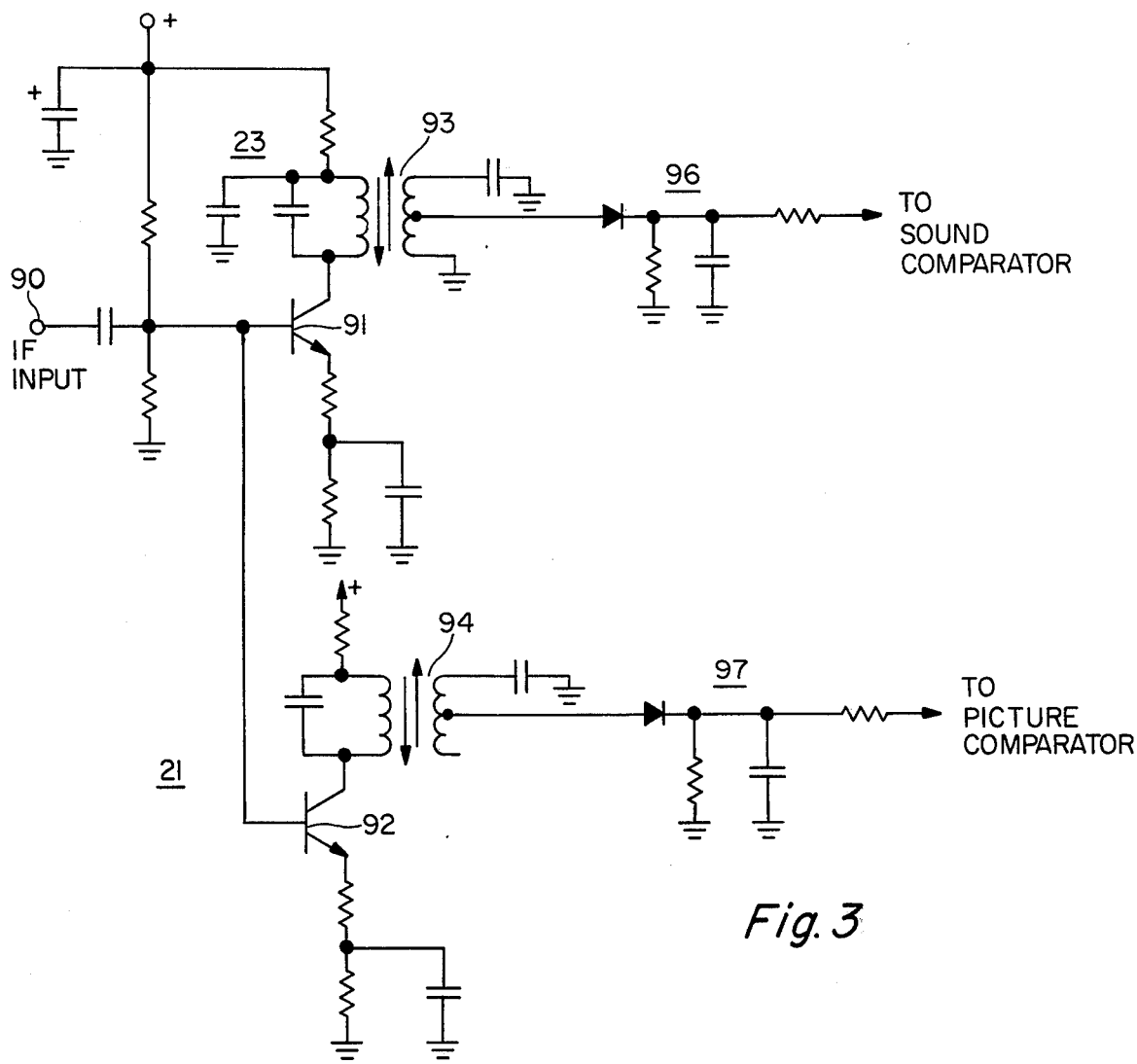
FIG. 3 is a detailed circuit diagram of a portion of the circuit shown in FIG. 1.

FIG. 3 shows the detailed circuitry of circuits which may be used for the picture detector 21 and sound detector 23 of FIG. 1. If input signals from the IF amplifier 13 are applied to an input terminal 90 which is connected to the bases of a pair of amplifier transistors 91 and 92 in the sound and picture detectors 23 and 21, respectively. The collector of the transistor 91 is connected through a narrow tuned transformer 93, tuned to the If sound carrier frequency; and the collector of the transistor 92 is connected through a similar narrow tuned transformer 94, which is tuned to the IF picture carrier frequency. A detector-filter network 96 is coupled to the secondary of the transformer 93 to produce the detected signal indicative of the presence of a sound carrier for application to the input of the sound comparator 45 of FIG. 2. Similarly, a detector-filter circuit 97 is connected to the secondary winding of the transformer 94 to produce a signal which is applied to the input of the picture comparator 43" of FIG. 2.

The system which has been described in conjunction with the drawings combines the advantages of frequency synthesizer tuning with the ability to automatically adjust for frequency offsets in the received signals when these offsets exceed a preestablished window outside the normal control range of the AFT system of the receiver.

Although the gross tuning or initial tuning of the receiver is described in conjunction with a programmable frequency divider 43 connected in the tuner oscillator feedback path to the phase comparator 42, the gross tuning also could be accomplished by initially setting the binary counter 36 to a division frequency corresponding to the desired gross tuning adjustment. This then would eliminate the necessity of a programmable frequency divider 43 in the local oscillator feedback path. Only the programmable frequency divider 40 then would be necessary for both the gross tuning and offset tuning adjustment features. Because this latter approach, however, places severe limits on the present state of the art for programmable frequency dividers, commercial versions of the system most likely will employ a programmable frequency divider in the local oscillator feedback path as shown in FIG. 1.

To change the system from the one shown to one in which all of the gross and subsequent offset tuning adjustments are accomplished solely with the divider 40, merely necessitates the loading of different counts corresponding to the output of the code converter 34 into the up/down counter 36 instead of the fixed center count which has been described as being entered into the counter 36 each time a different channel selection is made.

I claim:

1. A tuning system for a tuner of a television receiver capable of receiving a composite television signal and including automatic fine tuning (AFT) circuit means producing an AFT signal, said system including in combination:
reference oscillator means providing a reference signal at a predetermined frequency;
local oscillator means in the tuner providing a variable output frequency in response to the application of a control signal thereto;
a programmable frequency divider having an input coupled to the output of said reference oscillator means for producing an output signal having a frequency which is a programmable fraction of the frequency of the signal applied to the input thereto from said reference oscillator means;
means coupled with the output of said programmable frequency divider and the output of said local oscillator means for developing a control signal and applying such control signal to said local oscillator means for controlling the frequency of operation thereof; and control means coupled with the output of the AFT circuit means and further coupled with said programmable frequency divider for controlling said frequency divider to change said programmable fraction in response to predetermined signal conditions of the AFT signal.

2. The combination according to claim 1 wherein said control means includes reversible digital counter means and logic circuit means coupled with the AFT circuit means for causing said counter means to count in one direction when the AFT signal is greater than a predetermined range of voltages, and for causing said counter means to count in the opposite direction when the AFT signal is less than a predetermined range of voltages, and means for coupling said counter means with said programmable frequency divider to change said programmable fraction in accordance with the count in said counter means.

3. The combination according to claim 2 further including additional means coupled with said counter means and coupled with said logic circuit means for preventing a change in the count of said counter means when the AFT signal is within said predetermined range of voltages.

4. The combination according to claim 3 further including override means coupled with the television receiver and said logic circuit means for overriding the operation of said additional means in response to predetermined conditions of tuning of the television receiver.

5. A tuning system for a tuner of a television receiver capable of receiving a composite television signal having at least carrier signal components and synchronizing signal components, said system including in combination:

reference oscillator means providing a reference signal at a predetermined frequency;

local oscillator means in the tuner providing a variable output frequency in response to the application of a control signal thereto;

programmable frequency divider means having an input coupled with the output of said reference oscillator means for producing an output signal having a frequency which is a programmable fraction of the frequency of the signal applied to the input thereto from such oscillator means;

means coupled with the output of said programmable frequency divider means and the output of said local oscillator means for developing a control signal and applying such control signal to said local oscillator means for controlling the frequency of operation thereof;

carrier sensing means coupled to receive at least the carrier signal components of the composite signal and providing an output voltage indicative of the tuning of said receiver to a carrier component of said composite signal;

synchronizing signal components sensing means coupled to receive at least said synchronizing signal components of the composite signal for providing a first predetermined output with synchronizing signal components sensed thereby; and control means coupled with the outputs of said carrier sensing means and said synchronizing signal components sensing means, and further coupled with said programmable frequency divider means for changing said programmable fraction in response to predetermined signals at the outputs of said carrier sensing means and said synchronizing signal components sensing means.

6. The combination according to claim 5 wherein said carrier sensing means comprises a picture carrier sensing means providing an output voltage indicative of the tuning of said receiver to a picture carrier component of the composite signal, and further includes sound carrier sensing means providing an output voltage indicative of the tuning of the receiver to a sound carrier component of the composite signal, and the outputs of both said picture carrier sensing means and said sound carrier sensing means are coupled to said control means along with the output of said synchronizing signal components sensing means.

7. The combination according to claim 5, further including tuning selection means for selecting channels to which said television receiver may be tuned, said tuning selection means applying signals to said programmable frequency divider to establish a predetermined unitial programmable fraction therein each time a new channel is selected by said tuning selection means.

8. The combination according to claim 7 wherein said control means includes a reversible digital counter means coupled with said tuning selection means and set to a predetermined count each time a new channel is selected, said control means further includes means for causing said counter means to count in one direction when a first relationship exists between the output signals of said carrier signal sensing means and said synchronizing signal components sensing means, and for causing said counter means to count in the opposite direction when a second relationship of the output voltages of said carrier sensing means and said synchronizing signal components sensing means exists; and said counter means is coupled with said divider means to control said programmable fraction of frequency division provided thereby.

9. The combination according to claim 8 further including AFT means responsive to a carrier signal component of said composite television signal for producing an AFT control signal, said AFT means being coupled with said control means for causing the count in said counter means to be changed when said AFT control signal is outside a predetermined range of signals.

10. A tuning system for the tuner of a television receiver capable of receiving a composite television signal, having at least picture carrier signal components, sound carrier signal components, and synchronizing signal components, said system including in combination:

a reference oscillator producing output signals at a predetermined frequency;

a programmable frequency divider means having an input coupled with the output of said reference oscillator and producing signals on the output thereof at a reduced frequency determined by the division number to which said programmable frequency divider means is set;

voltage controlled oscillator means in said tuner for controlling the tuner thereof;

means coupled with the input of said voltage controlled oscillator means and with the outputs of said voltage controlled oscillator means and said programmable frequency divider means for developing a tuning voltage for controlling the tuning of said voltage controlled oscillator means;

picture carrier sensing means providing an output voltage indicative of the tuning of said receiver to a picture carrier component of the composite signal;

sound carrier sensing means providing an output voltage indicative of the tuning of the receiver to a sound carrier component of the composite signal;

synchronization signal components sensing means for providing a first predetermined output with synchronizing signal components in said composite television signal sensed thereby;

an AFT discriminator coupled with said receiver for producing an AFT signal;

AFT signal sensing means coupled with said AFT discriminator for producing a predetermined control signal whenever said AFT signal is within a predetermined window;

logic circuit means coupled with said picture carrier sensing means, said sound carrier sensing means, said AFT signal sensing means and said synchronizing signal component sensing means, and further coupled with said programmable frequency divider means for changing the division number of said programmable frequency divider in response to predetermined relationships of the signals from said sensing means.

11. The combination according to claim 10, wherein the television receiver includes means for effecting selection of different channels and said logic circuit means includes (a) a reversible binary counter, the outputs of which are coupled with control inputs of said programmable frequency divider means; (b) means for establishing a predetermined count in said counter in response to new channel selection in the television receiver; and (c) means coupled with said binary counter for causing said counter to count in predetermined directions in response to said predetermined relationships of signals from said sensing means.

* * * * *

Notice of Adverse Decision in Interference

In Interference No. 100,161, involving Patent No. 4,025,953, S. Sideris, FREQUENCY SYNTHESIZER TUNING SYSTEM FOR TELEVISION RECEIVERS, final judgment adverse to the patentee was rendered June 23, 1982 as to claim 1.

[*Official Gazette November 8, 1983.*]